United States Patent
Kim

(10) Patent No.: US 9,436,246 B2
(45) Date of Patent: Sep. 6, 2016

(54) SEMICONDUCTOR APPARATUS AND RETAINING VOLTAGE LEVELS

(71) Applicant: SK hynix Inc., Incheon-si Gyeonggi-do (KR)

(72) Inventor: Jong Sam Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 184 days.

(21) Appl. No.: 14/244,413

(22) Filed: Apr. 3, 2014

(65) Prior Publication Data
US 2015/0168966 A1   Jun. 18, 2015

(30) Foreign Application Priority Data
Dec. 17, 2013 (KR) ........................ 10-2013-0157380

(51) Int. Cl.
*G05F 1/45* (2006.01)
*G06F 1/26* (2006.01)
*G11C 5/14* (2006.01)

(52) U.S. Cl.
CPC ................. *G06F 1/26* (2013.01); *G11C 5/147* (2013.01)

(58) Field of Classification Search
CPC .............. G05F 1/26; G05F 1/46; G05F 1/62
USPC .................................. 323/234, 313
See application file for complete search history.

(56) References Cited

U.S. PATENT DOCUMENTS

| 6,753,720 B2* | 6/2004 | Kono ...................... G05F 1/465 327/535 |
| 8,643,357 B2* | 2/2014 | Son ........................ H02M 3/158 323/299 |
| 9,135,961 B2* | 9/2015 | Kim ....................... G11C 5/147 |
| 2003/0179618 A1* | 9/2003 | Choi ..................... G11C 11/4074 365/200 |
| 2005/0017704 A1* | 1/2005 | Mo ........................ G11C 5/147 323/313 |
| 2011/0291639 A1* | 12/2011 | Lee .................... H03K 19/00384 323/313 |
| 2012/0081100 A1* | 4/2012 | Lee ....................... G11C 29/021 323/314 |

FOREIGN PATENT DOCUMENTS

KR   1020120066843 A   6/2012

\* cited by examiner

*Primary Examiner* — Yemane Mehari
(74) *Attorney, Agent, or Firm* — William Park & Associates Ltd.

(57) ABSTRACT

A semiconductor apparatus includes a reference voltage generation unit configured to generate a reference voltage. The semiconductor apparatus also includes an internal voltage generation unit configured to generate an internal voltage which corresponds to a voltage level of the reference voltage. In addition, the semiconductor apparatus includes a noise generation unit configured to generate noise in the reference voltage according to noise of the internal voltage.

20 Claims, 2 Drawing Sheets

SEMICONDUCTOR APPARATUS AND RETAINING VOLTAGE LEVELS

CROSS-REFERENCES TO RELATED APPLICATION

The present application claims priority under 35 U.S.C. §119(a) to Korean application number 10-2013-0157380, filed on Dec. 17, 2013, in the Korean Intellectual Property Office, which is incorporated herein by reference in its entirety.

TECHNICAL FIELD

Various embodiments relate to a semiconductor integrated circuit, and more particularly, to a semiconductor apparatus.

BACKGROUND

A semiconductor apparatus is applied with a voltage from an outside, generates a voltage with a voltage level needed inside the semiconductor apparatus, and uses the generated voltage. A circuit for generating the voltage with the voltage level needed inside the semiconductor apparatus is referred to as an internal voltage generation circuit.

In general, an internal voltage generation circuit is configured to control the voltage level of its output voltage by using a reference voltage which has a voltage level corresponding to the voltage level needed inside the semiconductor apparatus, that is, a target level.

SUMMARY

In an embodiment, a semiconductor apparatus includes a reference voltage generation unit configured to generate a reference voltage. The semiconductor apparatus also includes an internal voltage generation unit configured to generate an internal voltage which corresponds to a voltage level of the reference voltage. In addition, the semiconductor apparatus includes a noise generation unit configured to generate noise in the reference voltage according to noise of the internal voltage.

In an embodiment, a semiconductor apparatus includes a reference voltage generation unit configured to be applied with a first external voltage and a first ground voltage, and generate a reference voltage. The semiconductor apparatus also includes an internal voltage generation unit configured to be applied with a second external voltage and a second ground voltage, and generate an internal voltage which has a voltage level corresponding to the reference voltage. Further, the semiconductor apparatus also includes an internal circuit configured to operate by being applied with the internal voltage and the second ground voltage. In addition, the semiconductor apparatus also includes a noise generation unit configured to generate noise in the reference voltage according to noise of the internal voltage.

In an embodiment, a system comprises: a processor and a controller configured to receive a request and a data from the processor. The system also includes a memory unit configured to receive the request and the data from the controller. The memory unit includes a reference voltage generation unit configured to generate a reference voltage. The memory unit also includes an internal voltage generation unit configured to generate an internal voltage which corresponds to a voltage level of the reference voltage. In addition, the memory unit also includes a noise generation unit configured to generate noise in the reference voltage according to noise of the internal voltage.

DETAILED DESCRIPTION

Hereinafter, a semiconductor apparatus will be described below with reference to the accompanying drawings through various embodiments. In detail, an internal voltage generation circuit generates the output voltage by down-converting an external voltage applied from an outside. The internal voltage generation circuit may be configured to raise the voltage level of the output voltage when the output voltage is lower than a voltage level corresponding to the voltage level of the reference voltage. On the other hand, the internal voltage generation circuit may be configured to lower the voltage level of the output voltage when the output voltage is higher than the voltage level corresponding to the voltage level of the reference voltage. The output voltage and the reference voltage should retain a constant voltage level difference. However, because the output voltage is generated by down-converting the external voltage, the voltage level of the output voltage may be changed according to noise of the external voltage. An internal voltage generation circuit may misoperate due to a voltage level difference between the output voltage which may be changed in its voltage level according to noise of the external voltage and the reference voltage which retains a constant voltage level.

Figure 1:
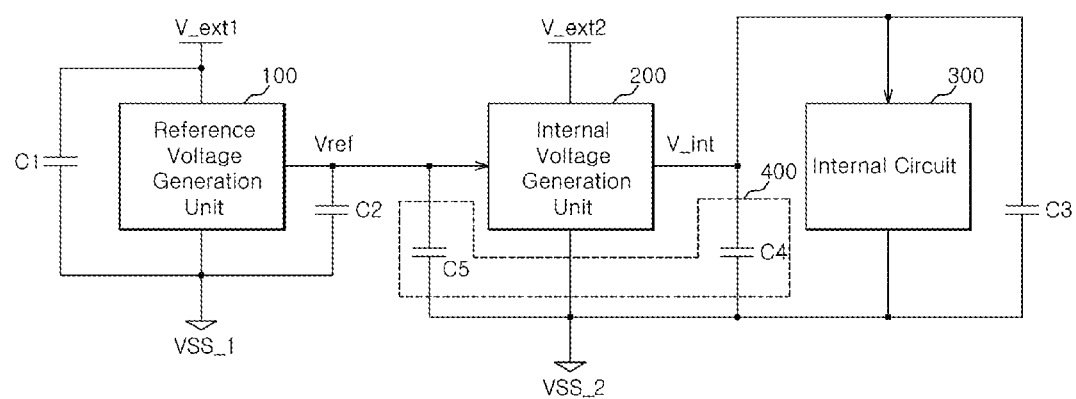
FIG. 1 is a block diagram showing a semiconductor apparatus in accordance with an embodiment.

As shown in FIG. 1, a semiconductor apparatus in accordance with an embodiment includes a reference voltage generation unit 100, an internal voltage generation unit 200, an internal circuit 300, a noise generation unit 400, and first to third capacitors C1, C2 and C3.

The reference voltage generation unit 100 may be configured to be applied with a first external voltage V_ext1 and a first ground voltage VSS_1, and generate a reference voltage Vref.

The internal voltage generation unit 200 may be configured to be applied with a second external voltage V_ext2 and a second ground voltage VSS_2; and generate an internal voltage V_int which has a voltage level corresponding to the voltage level of the reference voltage Vref. The internal voltage generation unit 200 generates the internal voltage V_int by down-converting the second external voltage V_ext2, that is, dropping the second external voltage V_ext2, based on the voltage level of the reference voltage Vref. For example, the internal voltage generation unit 200 controls the voltage level of the internal voltage V_int by sensing the voltage level difference of the reference voltage Vref and the second external voltage V_ext2.

The internal circuit 300 may be configured to operate by being applied with the internal voltage V_int and the second ground voltage VSS_2. The first external voltage V_ext1 and the second external voltage V_ext2 have different voltage sources, and the first ground voltage VSS_1 and the second ground voltage VSS_2 have different voltage sources as well. The voltage levels of the first external voltage V_ext1 and the second external voltage V_ext2 may be the same with or different from each other. The first ground voltage VSS_1 and the second ground voltage VSS_2 have the same voltage level.

The first capacitor C1 may be configured to be respectively applied with the first external voltage V_ext1 and the first ground voltage VSS_1 at both ends thereof, to constantly retain the voltage difference of the first external voltage V_ext1 and the first ground voltage VSS_1 which are applied to the reference voltage generation unit 100.

The second capacitor C2 may be configured to be respectively applied with the reference voltage Vref and the first ground voltage VSS_1 at both ends thereof, to constantly retain the voltage difference of the reference voltage Vref and the first ground voltage VSS_1.

The third capacitor C3 may be configured to be respectively applied with the internal voltage V_int and the second ground voltage VSS_2 at both ends thereof, to constantly retain the voltage difference of the internal voltage V_int and the second ground voltage VSS_2.

The noise generation unit 400 may be configured to generate noise in the reference voltage Vref according to the noise of the internal voltage V_int.

The noise generation unit 400 may include fourth and fifth capacitors C4 and C5.

The fourth capacitor C4 may have one end which is applied with the internal voltage V_int and the other end which is applied with the second ground voltage VSS_2. The fifth capacitor C5 may have one end which is applied with the reference voltage Vref and the other end which is applied with the second ground voltage VSS_2. The other end of the fourth capacitor C4 and the other end of the fifth capacitor C5 are commonly electrically coupled by a node which is applied with the second ground voltage VSS_2.

The semiconductor apparatus in accordance with an embodiment, configured as mentioned above, operates as follows.

A semiconductor apparatus includes a number of internal circuits. A specified internal circuit of the internal circuits is configured to use a different voltage source from the other internal circuits, so that power supply to the specified internal circuit may be stably implemented.

For example, the first external voltage V_ext1 and the first ground voltage VSS_1 shown in FIG. 1 are voltages which are applied to a normal internal circuit; and the second external voltage V_ext2 and the second ground voltage VSS_2 are voltages which are applied to a specified internal circuit. The specified internal circuit may be a circuit such as a delay-locked loop circuit or a data output circuit. Therefore, the internal circuit 300 shown in FIG. 1 may be a circuit such as a delay-locked loop circuit or a data output circuit. Accordingly, the internal circuit 300 shown in FIG. 1 operates by using a voltage source different from the first external voltage V_ext1 and the first ground voltage VSS_1. The internal circuit 300 is being applied with the internal voltage V_int which is generated from the second external voltage V_ext2 and the second ground voltage VSS_2.

The reference voltage generation unit 100 generates the reference voltage Vref by being applied with the first external voltage V_ext1 and the first ground voltage VSS_1.

The internal voltage generation unit 200 is applied with the second external voltage V_ext2 and the second ground voltage VSS_2; and generates the internal voltage V_int which has the voltage level corresponding to the voltage level of the reference voltage Vref. The internal voltage generation unit 200 down-converts the second external voltage V_ext2, and generates the internal voltage V_int which has the voltage level corresponding to the voltage level of the reference voltage Vref.

The internal circuit 300 is driven by being applied with the internal voltage V_int and the second ground voltage VSS_2.

The internal voltage generation unit 200 and the reference voltage generation unit 100 are applied with the driving voltages V_ext1, V_ext2, VSS_1 and VSS_2 from different voltage sources. Thus, noise may not be generated in the first external voltage V_ext1 and the first ground voltage VSS_1 which are applied to the reference voltage generation unit 100; but may be generated in the second external voltage V_ext2 and the second ground voltage VSS_2 which are applied to the internal voltage generation unit 200.

Because the internal voltage generation unit 200 generates the internal voltage V_int by down-converting the second external voltage V_ext2, the internal voltage V_int is vulnerable to the noise of the second external voltage V_ext2. In other words, if noise is generated in the second external voltage V_ext2, the internal voltage V_int also includes noise.

The noise generation unit 400 generates noise in the reference voltage Vref when noise is generated in the internal voltage V_int.

In detail, the fourth capacitor C4 of the noise generation unit 400 transfers the noise of the internal voltage V_int to the second ground voltage VSS_2. The fifth capacitor C5 transfers the noise transferred to the second ground voltage VSS_2, to the reference voltage Vref. In general, a capacitor plays the role of constantly retaining the voltage difference of the voltages applied to both ends thereof. Thus, the fourth capacitor C4 causes the voltage level of the second ground voltage VSS_2 to be changed when the voltage level of the internal voltage V_int is changed due to noise. The fourth capacitor performs this function to constantly retain the voltage difference of the internal voltage V_int and the second ground voltage VSS_2. Further, the fifth capacitor C5 causes the voltage level of the reference voltage Vref to be changed when the voltage level of the second ground voltage VSS_2 is changed due to noise. The fifth capacitor C5 performs this function to constantly retain the voltage levels of the reference voltage Vref and the second ground voltage VSS_2.

Accordingly, the noise generation unit 400 may generate noise in the reference voltage Vref if noise is generated in the internal voltage V_int.

Figure 2:
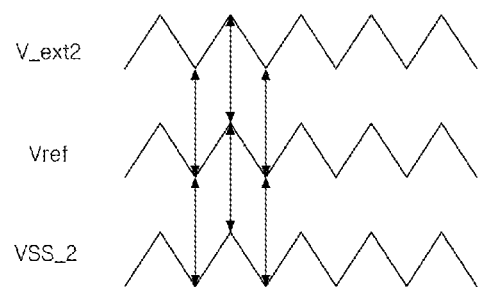
FIG. 2 is a timing diagram explaining an embodiment.

As a result, as shown in FIG. 2, the noise of the second external voltage V_ext2 is transferred to the second ground voltage VSS_2 and the reference voltage Vref through the noise generation unit 400.

The voltage level difference of the second external voltage V_ext2 and the reference voltage Vref is constantly retained; the voltage level difference of the reference voltage Vref and the second ground voltage VSS_2 is constantly retained; and the voltage level difference of the internal voltage V_int and the second ground voltage VSS_2 is constantly retained as well.

Since the internal voltage generation unit 200 is applied with the second external voltage V_ext2, the reference voltage Vref and the second ground voltage VSS_2 which have constant voltage level differences, the internal voltage generation unit 200 may not misoperate and may normally generate the internal voltage V_int. Since the internal circuit 300 operates by being applied with the internal voltage V_int and the second ground voltage VSS_2 with a constant voltage level difference, the internal circuit 300 may normally perform an operation.

Figure 3:
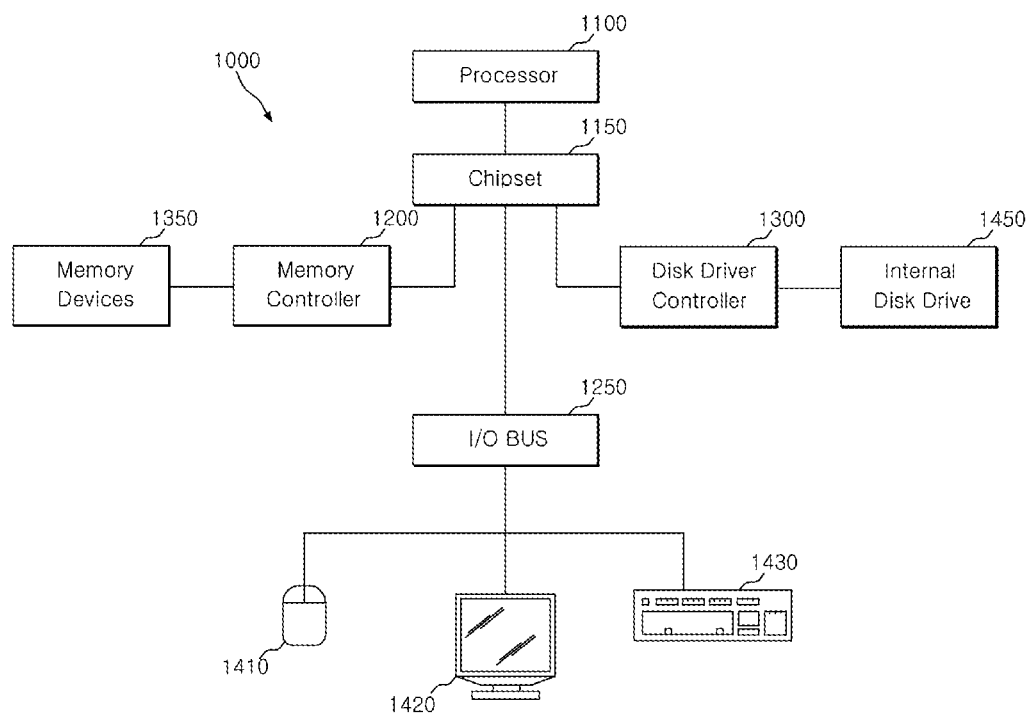
FIG. 3 illustrates a block diagram of a system employing a memory controller circuit in accordance with an embodiment.

Referring to FIG. 3, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a reference voltage generation unit configured to generate a reference voltage;
   an internal voltage generation unit configured to generate an internal voltage which corresponds to a voltage level of the reference voltage; and
   a noise generation unit configured to generate noise in the reference voltage according to noise of the internal voltage,
   wherein the noise generation unit is coupled with output terminals of the reference voltage generation unit and the internal voltage generation unit.

2. The semiconductor apparatus according to claim 1, wherein voltage sources of the reference voltage generation unit and the internal voltage generation unit are different.

3. The semiconductor apparatus according to claim 2,
   wherein the reference voltage generation unit operates by being applied with a first external voltage and a first ground voltage, and
   wherein the internal voltage generation unit operates by being applied with a second external voltage and a second ground voltage.

4. The semiconductor apparatus according to claim 3, wherein the noise generation unit comprises:
   a first capacitor having one end applied with the reference voltage and an other end applied with the second ground voltage; and
   a second capacitor having one end applied with the internal voltage and an other end applied with the second ground voltage.

5. A semiconductor apparatus comprising:
   a reference voltage generation unit configured to be applied with a first external voltage and a first ground voltage, and generate a reference voltage;
   an internal voltage generation unit configured to be applied with a second external voltage and a second ground voltage, and generate an internal voltage which has a voltage level corresponding to the reference voltage;
   an internal circuit configured to operate by being applied with the internal voltage and the second ground voltage; and
   a noise generation unit configured to generate noise in the reference voltage according to noise of the internal voltage,
   wherein the noise generation unit is coupled with output terminals of the reference voltage generation unit and the internal voltage generation unit.

6. The semiconductor apparatus according to claim 5, wherein the first external voltage, the second external voltage, the first ground voltage and the second ground voltage are outputted from different voltage sources.

7. The semiconductor apparatus according to claim 5, wherein the internal voltage generation unit generates the internal voltage by down-converting the second external voltage in response to a voltage level of the reference voltage.

8. The semiconductor apparatus according to claim 7, wherein the noise generation unit transfers the noise of the internal voltage to the second ground voltage and to the reference voltage.

9. The semiconductor apparatus according to claim 8, wherein the noise generation unit comprises:
   a first capacitor having one end applied with the internal voltage and an other end applied with the second ground voltage; and
   a second capacitor having one end applied with the second ground voltage and an other end applied with the reference voltage.

10. The semiconductor apparatus according to claim 5, further comprising:
    a first capacitor configured to constantly retain a voltage difference of the first external voltage and the first ground voltage;
    a second capacitor configured to constantly retain a voltage difference of the reference voltage and the first ground voltage; and
    a third capacitor configured to constantly retain a voltage difference of the internal voltage and the second ground voltage.

11. The semiconductor apparatus according to claim 5, wherein noise of the second external voltage is transferred to the second ground voltage and the reference voltage through the noise generation unit.

12. The semiconductor apparatus according to claim 5, wherein the internal circuit is applied with the internal voltage with a constant voltage difference to the second ground voltage.

13. The semiconductor apparatus according to claim 5, wherein the internal voltage generation unit controls the voltage level of the internal voltage by sensing a voltage level difference of the reference voltage and the second external voltage.

14. The semiconductor apparatus according to claim 10, wherein the third capacitor is configured to be applied with the internal voltage and the second ground voltage.

15. The semiconductor apparatus according to claim 14, further comprising:
a fourth capacitor configured to transfer the noise of the internal voltage to the second ground voltage.

16. The semiconductor apparatus according to claim 15, further comprising:
a fifth capacitor configured to transfer the noise transferred to the second ground voltage to the reference voltage.

17. The semiconductor apparatus according to claim 15, wherein the fourth capacitor is configured to cause a voltage level of the second ground voltage to change in response to a change in the voltage level of the internal voltage.

18. The semiconductor apparatus according to claim 16, wherein the fifth capacitor is configured to cause a voltage level of the reference voltage to change in response to a change in a voltage level of the second ground voltage.

19. The semiconductor apparatus according to claim 5, wherein the internal voltage generation unit is applied with the second external voltage, the reference voltage, and the second ground voltage with constant voltage level differences.

20. A system comprising:
a processor;
a controller configured to receive a request and a data from the controller; and
a memory unit configured to receive the request and the data from the controller,
wherein the memory unit comprises:
a reference voltage generation unit configured to generate a reference voltage;
an internal voltage generation unit configured to generate an internal voltage which corresponds to a voltage level of the reference voltage; and
a noise generation unit configured to generate noise in the reference voltage according to noise of the internal voltage,
wherein the noise generation unit is coupled with output terminals of the reference voltage generation unit and the internal voltage generation unit.

* * * * *